United States Patent [19]

Watkiss

[11] Patent Number: 4,859,290

[45] Date of Patent: Aug. 22, 1989

[54] PRINTING PLATE PRECURSORS

[75] Inventor: Philip J. Watkiss, Leeds, Great Britain

[73] Assignee: Vickers plc, London, Great Britain

[21] Appl. No.: 154,158

[22] Filed: Feb. 9, 1988

[30] Foreign Application Priority Data

Feb. 13, 1987 [GB] United Kingdom ............... 8703376

[51] Int. Cl.⁴ .................... C25D 11/08; C25F 3/00
[52] U.S. Cl. ........................... 204/33; 204/38.3; 204/129.1; 204/129.75; 101/459
[58] Field of Search ............... 204/27, 28, 33, 38.3, 204/129.1, 129.3, 129.75; 101/459

[56] References Cited

U.S. PATENT DOCUMENTS

| | | | |
|---|---|---|---|
| 4,482,444 | 11/1984 | Frass et al. ..................... | 204/33 X |
| 4,566,952 | 1/1986 | Sprintschnik et al. ........ | 204/38.3 X |
| 4,581,996 | 4/1986 | Platzer ............................ | 204/33 X |
| 4,606,975 | 8/1986 | Mohr ............................. | 204/38.3 X |
| 4,608,131 | 8/1986 | Brenk ............................ | 204/33 |
| 4,634,656 | 1/1987 | Ohashi et al. .................. | 204/33 X |
| 4,714,528 | 12/1987 | Takeuchi et al. ............... | 204/33 |

*Primary Examiner*—Donald R. Valentine
*Attorney, Agent, or Firm*—Bromberg & Sunstein

[57] ABSTRACT

A lithographic printing plate precursor for use in a silver diffusion transfer system comprises a grained and anodized aluminum substrate having coated thereon a sol containing nuclei for precipitating silver from a silver complex. The substrate has an anodic weight (gm·m$^{-2}$) to surface roughness (microns) ratio greater than or equal to 6. Printing plates produced from such precursors are less prone to corrosion and have improved printing life.

9 Claims, No Drawings

PRINTING PLATE PRECURSORS

This invention relates to lithographic printing plate precursors and is concerned with such precursors which are suitable for use in the system known as silver diffusion transfer.

It is well known that a grained and anodised sheet of aluminium, optionally coated with silver complex precipitating nuclei, can act as the receptor sheet in a silver complex diffusion transfer assembly. In this process unexposed grains of silver halide are dissolved by a developer component, usually hypo, which is capable of complexing silver. The silver complex is then free to diffuse to the receptor sheet where reduction to metallic silver takes place.

The silver halide layer may be coated on a separate sheet which is brought into contact with the receptor sheet. Alternatively the silver halide emulsion layer can be coated on top of the nucleation layer in an integral system. The substrate in either case may be coated with nuclei capable of catalysing reduction of the silver complex, such nuclei commonly comprising a metal sol, such as silver or gold, or a metal sulphide sol, such as nickel sulphide or silver sulphide. Under certain conditions, notably low anodic weight, the aluminium substrate itself can act as catalyst for the reduction of the silver complex.

After exposure of the silver halide emulsion layer, the assembly is processed in a developer containing silver halide developing agents, commonly hydroquinone and phenidone, and a silver halide solvent, usually sodium thiosulphate. During development the unexposed silver halide grains are dissolved by formation of a silver complex which can then diffuse to the nucleation layer on the anodised aluminium receptor sheet, where it is reduced to a metallic silver image. This silver image is then treated with an organic compound capable of absorbing onto the silver image thereby increasing the oleophilicity of the silver. The plate can then function as a lithographic printing plate by accepting ink onto the silver image and is capable of yielding several thousand impressions.

A problem with these systems is that the metallic silver image which forms the ink receptive surface is in close contact with the aluminium substrate and as such an electromotive force can exist between the two metals giving rise to corrosion in the silver image areas. The anodised surface acts as a barrier to this process. However because of irregularities in the anodic layer, corrosion can occur in various parts of the image corresponding to anodic faults thus giving rise to the formation of corrosion specks which appear as pin-holes surrounded by a region of weakly adhered silver. Such specks are about 0.1 to 2 mm in diameter.

The occurrence of corrosion in this way leads to loss of press performance and poor quality printing. The corrosion effect can be minimised by treating the plate, immediately after processing, with a corrosion inhibitor. Mercapto compounds such as 1-phenyl-5-mercaptotetrazole work very well to reduce the incidence of corrosion. However, despite the use of corrosion inhibitors, corrosion still occurs to some degree giving rise to printing plates with reduced press performance.

It has now been found that, by suitably adjusting the graining and anodising conditions of the aluminium substrate, the occurrence of corrosion can be eliminated thereby giving plates with improved press performance.

The roughness produced by graining is frequently measured by a centre line average (CLA) value which is an arithmetic mean roughness measured in microns. The amount of aluminium oxide formed per unit area during the anodising process can be determined by chemically stripping the anodic layer and is measured in $gm \cdot m^{-2}$.

It has been found that, at a fixed anodic weight, the incidence of corrosion is worse at high values of CLA over the range 0.3 to 0.9 microns. Similarly at fixed CLA the corrosion is worse at low anodic weights over the range 1.5 to 6 $gm/m^{-2}$.

Accordingly, the present invention provides a lithographic printing plate precursor comprising a grained and anodised aluminium substrate having coated thereon a sol containing nuclei for reducing a silver complex to metallic silver, the substrate having an anodic weight ($gm \cdot m^{-2}$) to surface roughness (microns) ratio greater than or equal to 6.

Preferably, said ratio is greater than 8.

The following Examples illustrate the invention.

EXAMPLE 1

Aluminium sheets (1S grade) were cleaned in caustic soda solution before being electrochemically grained in an electrolyte comprising hydrochloric acid and acetic acid by means of an alternating current. This process produces an even, non-directional grain. Different CLA values were produced by varying the current and voltage. After graining the sheets were cleaned in a tank of phosphoric acid before being immersed in an anodising cell containing sulphuric acid electrolyte. Different anodic weights were produced by varying the voltage conditions.

The CLA was determined using a Taylor-Hobson roughness meter and the anodic weight was determined by stripping in a hot solution of 54 g/l chromic acid and 70 mls/l phosphoric acid.

Lithographic printing plate precursors were produced by firstly coating each substrate with a thin layer of a silver sol in gelatin binder (Ag:gelatin being 1:1 by weight), prepared by the Carey Lea method, to give a coating weight of about 3 $mgAg/m^{-2}$. This was followed by a coating of a high contrast silver chlorobromide emulsion comprising 30 mol % chloride and 70 mol % bromide and a silver:gelatin ratio of 1:1. 6-Methyl-4-hydroxy 1,3,3a,7-tetraaza indene as stabiliser and Parmetol A23 as preservative were included and the emulsion was cast on the silver/gelatin layer to give a coating weight of 4.0 $gm/m^{-2}$ ( 1.5 $gmAg/m^{-2}$). Parmetol A23 is a commercially available product of Sterling Chemicals and is believed to be a mixture of halogenated amines.

Unexposed pieces of the precursors were processed for 30 seconds at 20 deg C. in the following developer to give a silver image adhered to the substrate.

| Developer: | Sodium sulphite | 50 g/l |
| --- | --- | --- |
| | Hydroquinone | 12 g/l |
| | Phenidone B | 6 g/l |
| | Sodium hydroxide | 12 g/l |
| | Sodium thiosulphate | 10 g/l |
| | 2-Methylamino ethanol | 40 mls/l |
| | Potassium bromide | 0.5 g/l |
| | pH ~ 13.0 | |

Phenidone B = 4-methyl-1-phenyl-3-pyrazolidone.

After development each piece was washed in warm water to remove residual coating and allowed to dry at room temperature. Corrosion occurred, depending on the grain and anodising conditions, in the form of specks and these specks were counted per unit area.

| An. Wt. (gm/m$^2$) | CLA (μm) | An. Wt./CLA | Corrosion (No./300 cm$^2$) |
|---|---|---|---|
| 6.7 | 0.45 | 14.9 | 0 |
| 5.3 | 0.37 | 14.2 | 0 |
| 5.3 | 0.40 | 13.3 | 0 |
| 5.3 | 0.50 | 10.6 | 0 |
| 5.2 | 0.75 | 6.9 | 10 |
| 5.1 | 0.63 | 8.1 | 0 |
| 4.9 | 0.70 | 7.0 | 3 |
| 4.6 | 0.36 | 12.7 | 0 |
| 4.6 | 0.70 | 6.6 | 0 |
| 4.5 | 0.55 | 8.2 | 0 |
| 4.3 | 0.55 | 7.8 | 0 |
| 4.3 | 0.63 | 6.9 | 0 |
| 4.0 | 0.32 | 12.5 | 0 |
| 4.0 | 0.60 | 6.7 | 0 |
| 3.9 | 0.45 | 8.6 | 0 |
| 3.8 | 0.42 | 9.1 | 0 |
| ~3.8 | 0.60 | 6.4 | 16 |
| 3.8 | 0.70 | 5.4 | 18 |
| 3.7 | 0.35 | 10.6 | 0 |
| 3.7 | 0.45 | 8.2 | 0 |
| 3.7 | 0.50 | 7.4 | 3 |
| 3.7 | 0.55 | 6.7 | 9 |
| 3.7 | 0.70 | 5.4 | 8 |
| 3.7 | 0.75 | 4.9 | 20 |
| 3.4 | 0.75 | 4.5 | ~100 |
| 3.2 | 0.47 | 6.8 | 4 |
| 3.0 | 0.36 | 8.4 | 0 |
| 2.9 | 0.41 | 7.1 | 4 |
| 2.9 | 0.45 | 6.4 | 5 |
| 2.9 | 0.80 | 3.6 | ~120 |
| 1.6 | 0.75 | 2.1 | >100 |
| 1.6 | 0.45 | 3.3 | ~180 |

The table shows a rapid worsening of corrosion as the anodic weight to CLA ratio falls below about 6. Above a ratio of about 8 no corrosion can be detected.

EXAMPLE 2

Sheets of 1S grade aluminium were electrochemically grained in an electrolyte of hydrochloric and acetic acids and then electrochemically anodised in an electrolyte of sulphuric and phosphoric acids under different conditions to produce different surface roughness and coating weights. This method of anodising is known to give an anodic oxide layer which is less prone to chemical attack and physical wear.

The substrates were coated with a Carey Lea silver sol followed by a silver chlorobromide emulsion as in Example 1. After processing the extent of corrosion was measured.

| An. Wt. (gm/m$^2$) | CLA (μm) | An. Wt./CLA | Corrosion (No./300 cm$^2$) |
|---|---|---|---|
| 5.0 | 0.45 | 11.0 | 0 |
| 4.3 | 0.45 | 9.5 | 0 |
| 3.9 | 0.60 | 6.5 | 0 |
| 3.8 | 0.70 | 5.4 | 5 |
| 3.6 | 0.75 | 4.8 | 5 |
| 3.5 | 0.40 | 8.8 | 0 |
| 3.3 | 0.50 | 6.6 | 5 |
| 3.2 | 0.45 | 7.1 | 0 |
| 3.2 | 0.70 | 4.6 | 8 |
| 3.2 | 0.75 | 4.3 | 14 |
| 3.2 | 0.75 | 4.3 | 15 |
| 3.2 | 0.80 | 4.0 | 15 |
| 3.0 | 0.45 | 6.7 | 3 |
| 2.9 | 0.80 | 3.6 | 20 |
| 2.9 | 0.80 | 3.6 | 20 |
| 2.8 | 0.45 | 6.2 | 5 |
| 2.5 | 0.79 | 3.2 | 58 |
| 2.4 | 0.49 | 4.9 | 10 |
| 2.4 | 0.59 | 4.1 | 19 |
| 2.4 | 0.82 | 2.9 | 75 |
| 2.3 | 0.42 | 5.6 | 7 |
| 2.3 | 0.60 | 3.8 | 35 |
| 2.0 | 0.85 | 2.4 | 86 |
| 2.0 | 0.45 | 4.4 | 21 |

Thus, the same trend is again seen with no evidence of corrosion above a ratio of anodic weight to CLA of about 8. However, the extent of corrosion below a ratio of 8 is less when the mixed-acid electrolyte is used for the anodising.

EXAMPLE 3

Substrates were made by electrochemically graining in an electrolyte comprising hydrochloric and acetic acids and anodising in sulphuric acid electrolyte under different conditions to produce different surface roughness and different anodic weights. They were coated with Carey Lea sol and silver chlorobromide emulsion as in Example 1. The resultant precursors were exposed through a target, processed in the developer of Example 1, washed and fixed in the following finisher.

| | |
|---|---|
| Borax | 10 g/l |
| PARAMETOL A23 | 3 mls/l |
| 2% solution of 1-phenyl-5-mercapto tetrazole in PEG 200 | 100 mls/l |
| Trypsin | 20 g/l |
| Gum arabic | 7.5 g/l |

The resultant printing plates were placed on an offset printing press and the run lengths compared.

| An. Wt. (gm/m$^2$) | CLA (μm) | An. Wt/CLA | Run length (No. impressions) |
|---|---|---|---|
| 4.5 | 0.55 | 8.2 | 60,000 |
| 3.7 | 0.80 | 4.6 | 20,000 |
| 2.8 | 0.70 | 4.0 | 10,000 |

Thus, the plate where the extent of corrosion is least (i.e. at the An.wt./CLA of 8.2) shows the best run length.

EXAMPLE 4

Substrates were prepared by electrochemically graining aluminium sheets in hydrochloric plus acetic acid electrolyte and anodising in a sulphuric acid electrolyte or an electrolyte comprising a mixture of sulphuric and phosphoric acids to give a range of roughness and anodic weights. The substrates were coated with Carey Lea silver sol and silver chlorobromide emulsion as in Example 1. The resultant plates were processed in the following less caustic developer.

| | |
|---|---|
| Sodium sulphite | 50 g/l |
| Hydroquinone | 12 g/l |
| Phenidone B | 6 g/l |
| Sodium hydroxide | 2 g/l |
| Sodium thiosulphate | 10 g/l |
| 2-methylamino ethanol | 40 mls/l |

-continued

| | Potassium bromide<br>pH 11.4 | | | 0.5 g/l | |
|---|---|---|---|---|---|
| Anodising<br>Electrolyte | An. Wt.<br>(gm/m$^2$) | CLA (μm) | | An. Wt.<br>CLA | Corrosion<br>(No. 300 cm$^2$) |
| H$_2$SO$_4$ | 4.9 | 0.70 | | 7.0 | 5 |
| H$_2$SO$_4$ | 4.5 | 0.55 | | 8.2 | 0 |
| H$_2$SO$_4$ | 2.9 | 0.80 | | 3.6 | >100 |
| H$_2$SO$_4$/H$_3$PO$_4$ | 3.2 | 0.75 | | 4.3 | 5 |

Thus, corrosion still occurred despite the less caustic conditions.

EXAMPLE 5

Aluminium substrates were grained in a mixture of hydrochloric acid and acetic acid and anodised in sulphuric acid under different conditions. The substrates were coated with Carey Lea silver sol and then immersed in boiling water for 5 minutes to hydration seal the anodic layer that is to make the anodic layer less porous. A silver chlorobromide gelatin emulsion was then applied as in Example 1. No difference in the extent of corrosion was observed between these sealed substrates and equivalent non-sealed substrates.

| An. Wt. (gm/m$^2$) | CLA (μm) | An.<br>Wt./CLA | Corrosion<br>(No./300 cm$^2$) |
|---|---|---|---|
| 4.9 | 0.7 | 7.0 | 5 |
| 1.6 | 0.75 | 2.1 | >100 |

EXAMPLE 6

Aluminium substrates were obtained by electrochemically graining in nitric acid followed by electrolytically anodising in dilute sulphuric acid under different conditions.

Each substrate was coated with sol and emulsion as in the previous Examples and the extent of corrosion assessed after processing.

| An. Wt. (gm/m$^2$) | CLA (μm) | An.<br>Wt./CLA | Corrosion<br>(No./300 cm$^2$) |
|---|---|---|---|
| 5.6 | 0.55 | 10.2 | 0 |
| 3.2 | 0.55 | 5.8 | 60 |
| 2.7 | 0.55 | 4.9 | ~100 |
| 1.0 | 0.55 | 1.8 | >100 |
| 4.0 | 0.35 | 11.4 | 0 |
| 2.6 | 0.35 | 7.4 | 0 |
| 1.8 | 0.35 | 5.1 | 50 |

EXAMPLE 7

In the preceding Examples, the substrate was coated with the sol followed by the silver halide emulsion. However, the silver halide emulsion layer can, alternatively be coated as a separate layer on a suitable support sheet of, for example, paper, plastics material or aluminium. Such two sheet systems are commercially available products such as CopyRapid Offset of AgFa Gevaert and PMT II of Kodak.

Experiments were carried out using a precursor comprising aluminium substrates which had been grained and anodised as in the previous Examples and coated with a Carey Lea silver sol. In these cases however, a sheet of Agfa Gevaert CopyRapid CRRA negative unexposed was brought together with each substrate using CopyRapid CR166 developer in a CopyRapid Offset 0422 Processer. After 30 seconds contact, the two sheets were peeled apart, rinsed with water, and allowed to dry at room temperature. Corrosion of the aluminium substrates was found to occur as in the previous Examples with much the same dependence on the graining and anodising conditions. Typical of the results obtained are the following:

| Graining<br>Electrolyte | Anodising<br>Electrolyte | An. Wt.<br>(gm/m$^2$) | CLA<br>(μm) | An. Wt.<br>CLA | Corrosion<br>(No./300<br>cm$^2$) |
|---|---|---|---|---|---|
| HCl/Acetic<br>acids | Sulphuric<br>acid | 5.5 | 0.64 | 8.6 | 0 |
| " | " | 3.4 | 0.64 | 5.3 | 15 |
| " | Sulphuric/<br>Phosphoric<br>acids | 4.5 | 0.58 | 7.7 | 0 |
| " | " | 2.6 | 0.58 | 4.5 | 9 |
| Nitric<br>Acid | Sulphuric<br>Acid | 5.4 | 0.62 | 8.7 | 0 |
| " | " | 2.6 | 0.62 | 4.2 | 130 |

A similar experiment was carried out using CopyRapid Offset CRRA aluminium substrate instead of the aforementioned aluminium substrates. The CRRA aluminium substrate had an anodic weight of 1.8 gm/m$^2$ and a CLA of 0.6 μm. Very bad corrosion occurred.

I claim:

1. A lithographic printing plate precursor comprising a grained and anodised aluminium substrate having coated thereon a sol containing nuclei for reducing a silver complex to metallic silver, the substrate having an anodic weight (gm·m$^{-2}$) to surface roughness (microns) ratio greater than or equal to 6, such precursor having superior corrosion resistance.

2. A precursor as claimed in claim 1 wherein said ratio is greater than 8.

3. A precursor as claimed in claim 1 wherein the sol is a metal sol.

4. A precursor, as claimed in claim 3 wherein the metal sol is a silver or gold sol.

5. A precursor as claimed in claim 1 wherein the sol is a metal sulphide sol.

6. A precursor as claimed in claim 5 wherein the metal sulphide sol is a nickel sulphide sol or a silver sulphide sol.

7. A precursor as claimed in claim 1 wherein the sol carries a layer of silver halide emulsion.

8. A precursor as claimed in claim 1 wherein the substrate is a substrate which has been electrolytically grained in an electrolyte comprising nitric acid or a mixture of hydrochloric acid and acetic acid.

9. A precursor as claimed in claim 1 wherein the substrate is a substrate which has been anodised in an electrolyte comprising sulphuric acid or a mixture of sulphuric acid and phosphoric acid.

* * * * *